United States Patent
Ochiai

(10) Patent No.: US 10,026,700 B2
(45) Date of Patent: Jul. 17, 2018

(54) SEMICONDUCTOR DEVICE

(71) Applicant: RENESAS ELECTRONICS CORPORATION, Tokyo (JP)

(72) Inventor: Toshihiko Ochiai, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/585,468

(22) Filed: May 3, 2017

(65) Prior Publication Data

US 2017/0236789 A1   Aug. 17, 2017

Related U.S. Application Data

(63) Continuation of application No. 14/077,503, filed on Nov. 12, 2013, now Pat. No. 9,673,153.

(30) Foreign Application Priority Data

Dec. 13, 2012 (JP) ................. 2012-272137

(51) Int. Cl.
*H01L 23/48* (2006.01)
*H01L 23/58* (2006.01)
(Continued)

(52) U.S. Cl.
CPC .......... *H01L 23/585* (2013.01); *H01L 23/481* (2013.01); *H01L 23/528* (2013.01);
(Continued)

(58) Field of Classification Search
CPC .................................................... H01L 23/481
See application file for complete search history.

(56) References Cited

U.S. PATENT DOCUMENTS

2008/0258262 A1  10/2008 Nagai
2010/0171203 A1*  7/2010 Chen .............. H01L 23/481
                                               257/686
(Continued)

FOREIGN PATENT DOCUMENTS

| JP | 2005-142553 A | 6/2005 |
|----|---------------|--------|
| JP | 2007-123857 A | 5/2007 |
| JP | 2010-161367 A | 7/2010 |
| JP | 2011-009795 A | 1/2011 |
| WO | 2007/074530 A1 | 7/2005 |

OTHER PUBLICATIONS

Chinese Office Action received in corresponding Chinese Application No. 201310685194.9 dated Jun. 2, 2017.

(Continued)

*Primary Examiner* — Peniel M Gumedzoe
*Assistant Examiner* — Christopher Johnson
(74) *Attorney, Agent, or Firm* — Mattingly & Malur, PC

(57) ABSTRACT

A semiconductor device includes a TSV that penetrates a silicon substrate. A seal ring is provided from a first low relative permittivity film that is closest to the silicon substrate to a second low relative permittivity film that is farthest from the silicon substrate. The seal ring is formed to surround the TSV in bird's eye view on the silicon substrate from a wafer front surface. This achieves suppression of generation or progress of a crack in a low relative permittivity film in a semiconductor device including the low relative permittivity film and a TSV.

5 Claims, 10 Drawing Sheets

(51) Int. Cl.
*H01L 23/00* (2006.01)
*H01L 23/522* (2006.01)
*H01L 23/532* (2006.01)
*H01L 23/528* (2006.01)
*H01L 25/065* (2006.01)

(52) U.S. Cl.
CPC .... *H01L 23/5226* (2013.01); *H01L 23/53228* (2013.01); *H01L 24/05* (2013.01); *H01L 24/06* (2013.01); *H01L 25/0657* (2013.01); *H01L 2224/0557* (2013.01); *H01L 2224/05567* (2013.01); *H01L 2224/05624* (2013.01); *H01L 2224/06181* (2013.01); *H01L 2225/06544* (2013.01); *H01L 2225/06565* (2013.01)

(56) References Cited

U.S. PATENT DOCUMENTS

2010/0224876 A1* 9/2010 Zhu .................. H01L 21/76898
 257/52
2010/0224878 A1 9/2010 Zhu
2011/0260260 A1* 10/2011 Nakashiba ...... H01L 21/823878
 257/369
2012/0313094 A1 12/2012 Kato

OTHER PUBLICATIONS

Japanese Office Action received in corresponding Japanese Application No. 2012-272137 dated Sep. 6, 2016.

* cited by examiner

SEMICONDUCTOR DEVICE

CROSS-REFERENCE TO RELATED APPLICATIONS

This application is a continuation application of U.S. Ser. No. 14/077,503, filed Nov. 12, 2013 which is based upon and claims the benefit of priority from Japanese patent application No. 2012-272137, filed on Dec. 13, 2012, the disclosure of which is incorporated herein in its entirety by reference.

BACKGROUND

The present invention relates to a semiconductor device including a through-silicon via.

Seal rings are used for various purposes in the field of semiconductor. For example, Japanese Unexamined Patent Application Publication No. 2011-9795 discloses a semiconductor device including a seal ring for preventing the ingress of water inside the chip from sides on the outer periphery of the chip. Such a seal ring is provided along the outer periphery of the chip. Japanese Unexamined Patent Application Publication No. 2011-9795 also discloses a technique for effectively preventing destruction of a seal ring due to a crack by doubling the seal ring and devising a shape of the seal ring, for example.

Japanese Unexamined Patent Application Publication No. 2010-161367 discloses a technique for using a seal ring for preventing ion diffusion into the substrate region of a die and generation of a crack during die sawing at the time of manufacturing a three-dimensional integrated circuit.

A three-dimensional integrated circuit is composed of a plurality of semiconductor devices laminated by a through-silicon via inside one semiconductor package. Hereinafter, a through-silicon via shall be referred to as TSV (Through-Silicon Via).

The technique disclosed in Japanese Unexamined Patent Application Publication No. 2010-161367 attempts to achieve the object by surrounding a plurality of TSVs by a seal ring.

SUMMARY

A TSV in a three-dimensional integrated circuit is to connect between semiconductor devices and is generally made from copper having low electrical resistance. On the other hand, a semiconductor element in a semiconductor device is made from silicon.

The coefficient of thermal expansion differs between copper, which is a material of the TSV, and silicon, which is a material of the semiconductor element. Thus, thermal stress is generated due to temperature fluctuations. In particular, thermal cycling test and the like on a packaged semiconductor integrated circuit causes high temperature load to be applied, thereby generating relatively large thermal stress.

In recent years while the miniaturization of a semiconductor device advances, the parasitic capacitance of copper wiring becomes the size equivalent to the input/output capacity of the transistor itself, and has become hindrance to improvement in the speed of element operation. Therefore, in order to reduce the parasitic capacitance between wiring, a so-called low relative permittivity film having low relative permittivity than known silicon oxide is often used as an insulating film. The low relative permittivity film is an insulating film having relative permittivity of less than 3.5, for example, and having mechanical strength lower than a known low relative permittivity film of silicon dioxide.

Accordingly, there is a problem that a semiconductor device including a TSV and a low relative permittivity film is prone to cracks in the low relative permittivity film, and the generated crack make rapid progress. Specific explanation is provided below with reference to FIG. 12.

FIG. 12 is a cross-sectional diagram showing an example of a semiconductor device including a TSV for connecting to another semiconductor device and including a low relative permittivity film. As shown in FIG. 12, a semiconductor device 10 includes, in order from a rear surface to a front surface of a wafer, a silicon substrate 20, a diffusion layer LD, a contact layer LC, a first copper wiring layer LCU1, a first via layer LV1, a second copper wiring layer LCU2, a second via layer LV2, a third copper wiring layer LCU3, a third via layer LV3, a fourth copper wiring layer LCU4, a fourth via layer LV4, a fifth copper wiring layer LCU5, and an aluminum electrode 30. As an example of a semiconductor element, a semiconductor element 40 to be a transistor is shown.

The first copper wiring layer, the second copper wiring layer, and third copper wiring layer have a smaller wiring pitch than upper wiring layers thereof. In order to reduce the parasitic capacitance between wiring, a low relative permittivity film is used for an insulating film 51 between the first copper wiring layer LCU1 and the second copper wiring layer LCU2, an insulating film 52 between the second copper wiring layer LCU2 and the third copper wiring layer LCU3, and an insulating film 53 between the third copper wiring layer LCU3 and the fourth copper wiring layer LCU4. Note that common silicon oxide is used for an insulating film 54 indicated by shading.

Moreover, a TSV 60 penetrating a silicon substrate 20 from the first copper wiring layer LCU1 is provided. The TSV 60 includes a TSV electrode 61 and a TSV electrode pad 62. The TSV electrode 61 is connected to the first copper wiring layer LCU1, and the TSV electrode pad 62 is provided to the wafer rear surface and connected to an aluminum electrode of another semiconductor device that is not shown.

There have been several structures of a semiconductor device that have been developed, such as a structure with penetration from a rear surface to a front surface of a semiconductor device and a structure with penetration from a rear surface to a bottom of a first wiring layer of a semiconductor device. In the semiconductor device 10 of the example shown in FIG. 12, the TSV 60 has a structure with penetration from the wafer rear surface to the portion connected to the first copper wiring layer LCU1. Moreover, in the example shown in FIG. 12, the TSV electrode 61 of the TSV 60 is connected to the aluminum electrode 30 by copper wiring and vias of the layers, and the semiconductor device 10 has no other branching copper wiring.

When high temperature load, such as a thermal cycling test, is applied, the portions from the first copper wiring layer LCU1 to the aluminum electrode 30 that are connected to the TSV 60 may project upward or pulled downward due to a difference in coefficients of thermal expansion between the TSV 60 and semiconductor elements in the semiconductor device 10. This exerts thermal stress on the insulating films in the vicinity of these portions, thereby making it prone to cracks. In particular, the insulating films 51 to 53 are low relative permittivity films having low mechanical strength, thus the insulating films 51 to 53 are more prone to cracks than other insulating films (not shown).

Other issue and new feature will be apparent from description of the specification and attached drawings.

An aspect of the present invention is a semiconductor device including a silicon substrate and a TSV (Through-Silicon Via) that penetrates the silicon substrate. The semiconductor device includes a seal ring that is provided from a first low relative permittivity film that is a closest low relative permittivity film to the silicon substrate to a second low relative permittivity film that is a farthest low relative permittivity film from the silicon substrate. The seal ring is formed in vicinity of the TSV to surround the TSV in bird's eye view on the silicon substrate.

According to the semiconductor device of the above aspect, it is possible to suppress generation or progress of a crack in the low relative permittivity films.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
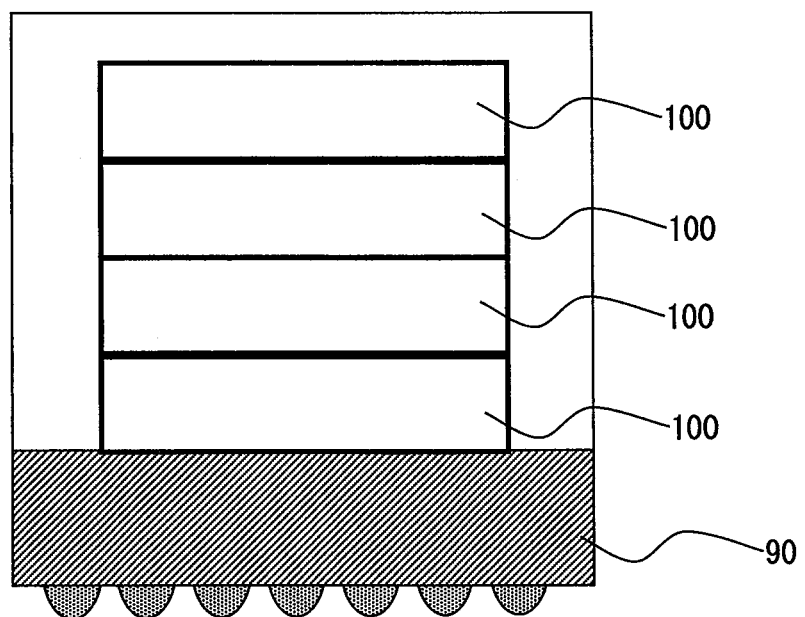
FIG. 1 is a diagram showing a three-dimensional integrated circuit according to a first embodiment.

The following description and drawings are omitted and simplified as appropriate for clarity of explanation. Moreover, in the drawings, the same components are denoted by the same reference numerals, and repeated explanation is omitted as appropriate.

First Embodiment

FIG. 1 shows a three-dimensional integrated circuit 80 according to a first embodiment. The three-dimensional integrated circuit 80 is composed of four semiconductor devices 100 that are laminated above a package substrate 90. The number of the semiconductor devices laminated above the package substrate 90 is four here, as an example, however this number is not limited to this and can be any value greater than or equal to two.

Figure 2:
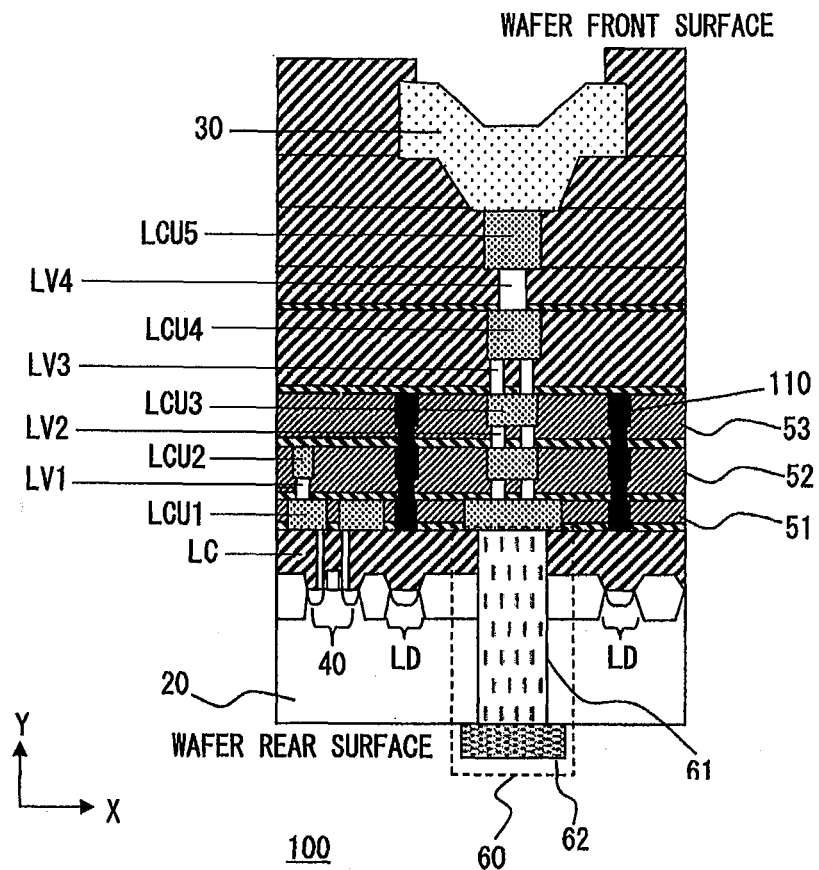
FIG. 2 is a cross-sectional diagram showing the semiconductor device in the three-dimensional integrated circuit shown in FIG. 1.
Figure 12:
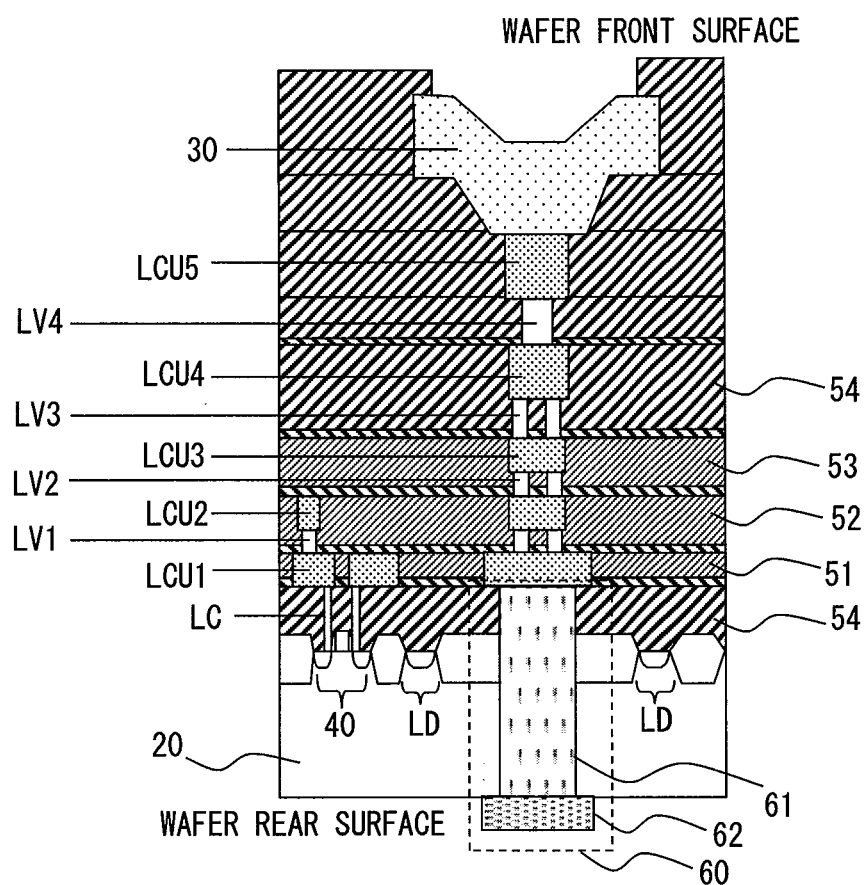
FIG. 12 is a diagram showing an example of a known semiconductor device including a TSV.

FIG. 2 is a cross-sectional diagram the semiconductor device 100 of the three-dimensional integrated circuit 80. For easier comparison, the structure of a TSV in the semiconductor device 100 is made to be the same as that of the TSV in the semiconductor device 10 of the related art shown in FIG. 12. Moreover, for convenience of explanation, the direction extending from the silicon substrate 20 to the aluminum electrode 30, i.e., the direction extending upward from the bottom of the semiconductor device 100, shall be referred to as Y direction, and the direction vertical to the Y direction shall be referred to as X direction.

In FIG. 2, the filled portions indicate a seal ring 110. As can be seen in FIG. 2, the seal ring 110 is provided, in the Y direction, from a low relative permittivity film 51 that is closest to the silicon substrate 20 (hereinafter referred to as a first low relative permittivity film) up to and through a low relative permittivity film 53 that is farthest from the silicon substrate 20 (hereinafter referred to as a second low relative permittivity film).

Figure 3:
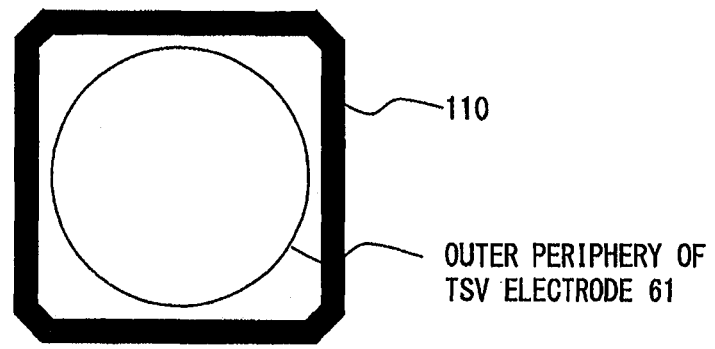
FIG. 3 is a diagram showing a positional relationship between a seal ring and a TVS in bird's eye view on a silicon substrate of a semiconductor device shown in FIG. 2.

FIG. 3 is a diagram showing a shape of the seal ring 110 and a positional relationship between the seal ring 110 and the TSV 60 in bird's eye view on the silicon substrate 20 from the aluminum electrode 30.

Although not limited thereto, in this embodiment, the shape of the seal ring 110 is an octagon obtained by cutting four corners of a rectangle at 45 degrees in bird's eye view on the silicon substrate 20. The meaning of this shape is explained later.

As shown in FIG. 3, the seal ring 110 is formed in the vicinity of the TSV 60 to surround the TSV electrode 61 with a gap from the outer periphery of the TSV 60 (the TSV electrode 61, to be more specific) in bird's eye view on the silicon substrate 20.

Figure 4:
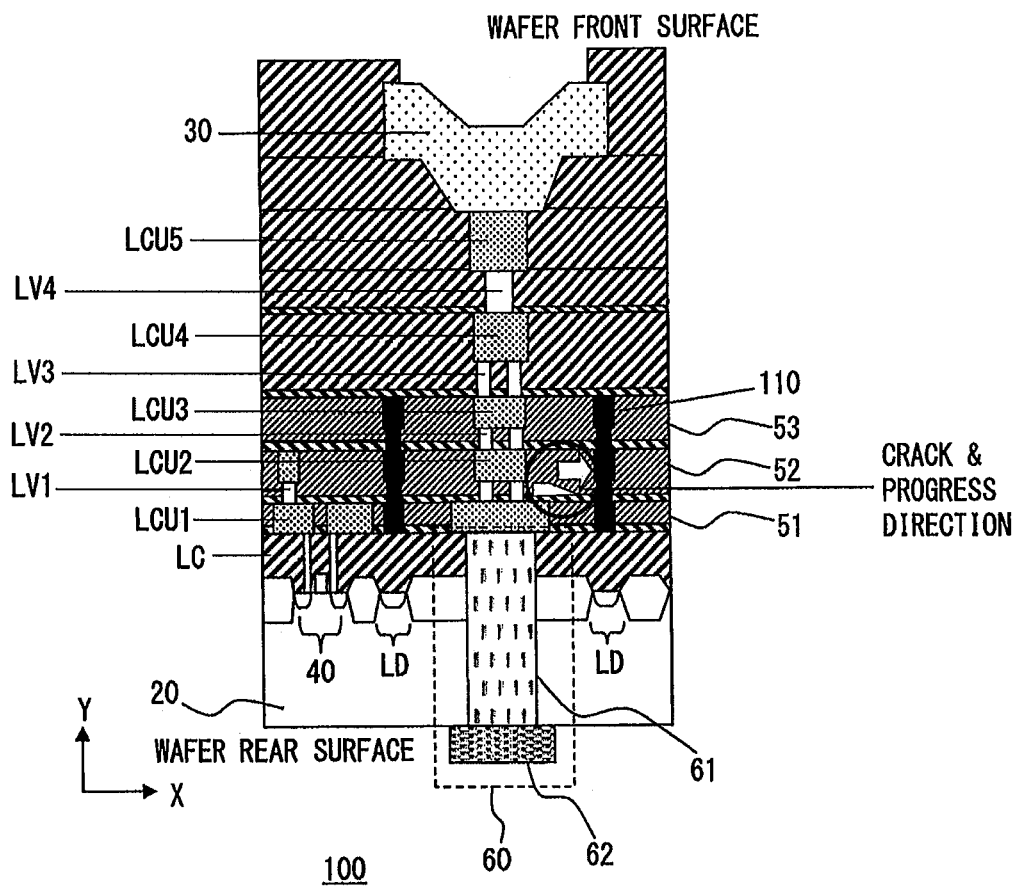
FIG. 4 is a diagram showing an example of a location and progress direction of a crack in the semiconductor device shown in FIG. 2.

FIG. 4 shows an example of a crack and progress direction of the crack that could be generated in the semiconductor device 100 shown in FIG. 2. In the layers of the semiconductor device, the portion closer to the connection to the TSV is more prone to cracks. In this example, the crack is generated in a region in the circled portion of the low relative permittivity film 52, and as indicated by the arrow in FIG. 4, the progress direction of the crack is the direction toward the outer periphery of the semiconductor device 100.

Figure 5:
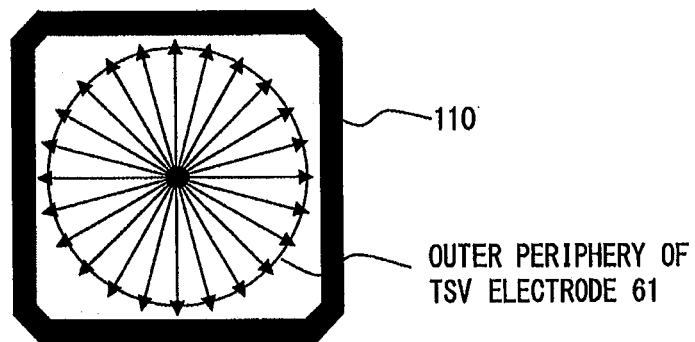
FIG. 5 is a diagram showing progress direction of a crack in bird's eye on the silicon substrate of the semiconductor device shown in FIG. 2.

FIG. 5 shows the progress direction of the crack in bird's eye view on the silicon substrate 20. The central black dot of FIG. 5 indicates the center of the TSV, and the arrows indicate the progress directions of the crack.

A crack progresses from the center of the TSV radially toward the outer periphery of the semiconductor device. In this embodiment, the seal ring 110 inhibits progress of a crack, thereby suppressing damage of the low relative permittivity films.

The seal ring 110 is also effective in supporting the films, hence the existence of the seal ring 110 can also suppress generation of a crack itself.

Subsequently, the meaning of the shape of the seal ring 110 is explained. For example, assume that the one progress direction of a crack is a direction 1. In order to prevent a crack from progressing toward the direction 1, a blocking object having a shape substantially vertical to the direction 1 seems effective.

As shown in FIG. 5, a crack progresses radially. The shape of the seal ring 110 to be a blocking object is made into an octagon by cutting four corners of a rectangle at 45 degrees, so that there are more directions substantially vertical to the seal ring 110 among the progression directions of a crack, which consequently improves blocking effect of a crack.

Second Embodiment

Figure 6:
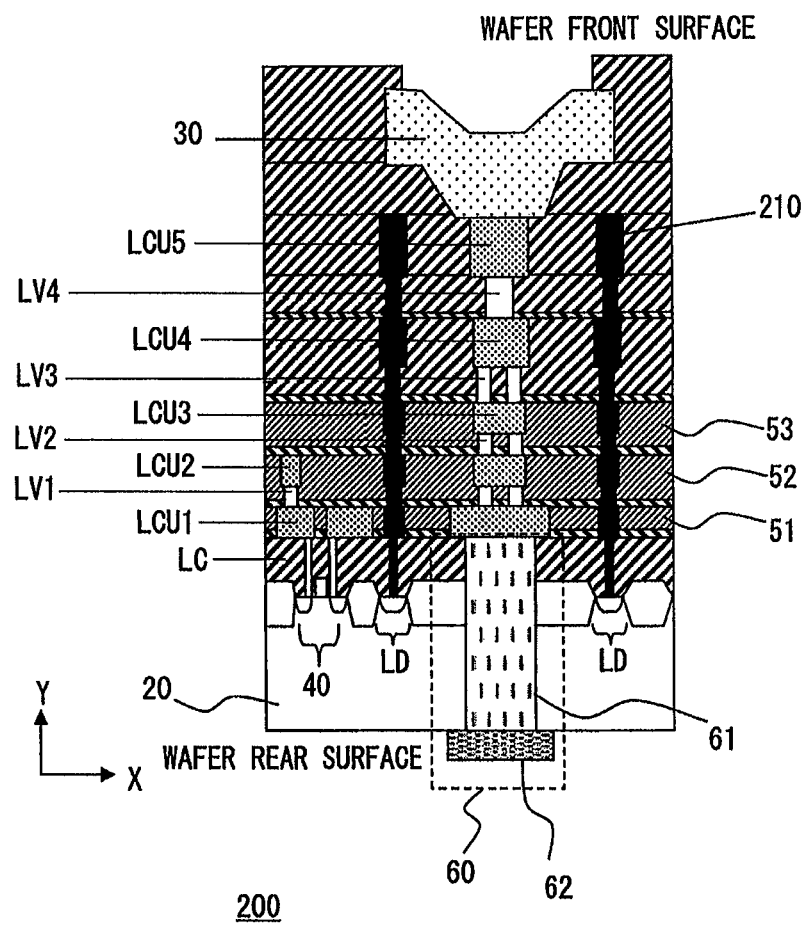
FIG. 6 is a cross-sectional diagram of a semiconductor device in a three-dimensional integrated circuit according to a second embodiment.

A second embodiment also relates to a three-dimensional integrated circuit composed of a plurality of laminated semiconductor devices. FIG. 6 shows a semiconductor device 200 in the three-dimensional integrated circuit according to the second embodiment.

The semiconductor device 200 has the same configuration as the semiconductor device 100 except for a seal ring 210 that is provided in place of the seal ring 110. Note that in FIG. 6, the seal ring 210 is also indicated by the filled portions.

In the semiconductor device 100, the seal ring 110 is provided from the first low relative permittivity film 51 up to and through the second low relative permittivity film 53. On the other hand, as shown in FIG. 6, in the semiconductor device 200, the seal ring 210 extends upward to the topmost copper wiring layer (the fifth copper wiring layer LCU5 here) and extends downward to the contact layer LC.

By providing the seal ring from the layer below the first low relative permittivity film 51 up to and through the layer above the second low relative permittivity film 53, it is possible to further improve the blocking effect from generation and progress of a crack in other layer not only in the low relative permittivity films.

It is obvious that the upper limit of the seal ring is not limited to the top copper wiring layer as long as the coverage of the seal ring includes layers from the first low relative permittivity film 51 to the second low relative permittivity film 53, and may be any layer in or above the second low relative permittivity film 53 according to a wiring state of the semiconductor device 200. Similarly, as for the lower limit, it is not limited to the contact layer LC but may be any layer in or below the first low relative permittivity film 51 according to the wiring state of the semiconductor device 200.

Third Embodiment

Figure 7:
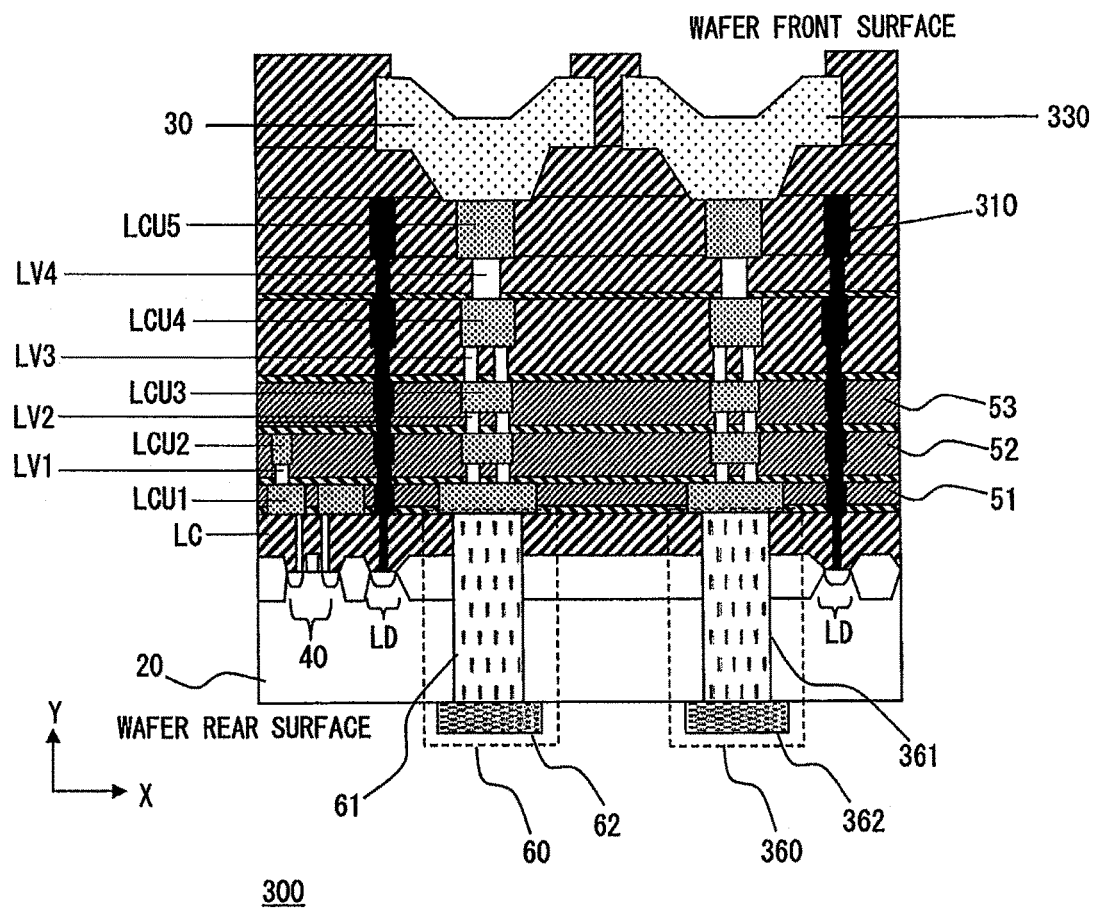
FIG. 7 is a cross-sectional diagram of a semiconductor device in a three-dimensional integrated circuit according to a third embodiment.

A third embodiment also relates to a three-dimensional integrated circuit composed of a plurality of laminated semiconductor devices. FIG. 7 shows a semiconductor device 300 in the three-dimensional integrated circuit according to the third enforcement. Only a difference from the semiconductor device 200 in FIG. 7 is explained.

The semiconductor device 300 includes a plurality of TSVs (two TSVs in the example shown). As shown in FIG. 7, a TSV 360 is provided in addition to the TSV 60. The TSV 360 includes a TSV electrode 361 and a TSV electrode pad 362. The connection from the TSV electrode 361 to an aluminum electrode 330 is similar to the connection of the TSV 60 from the TSV electrode 61 to the aluminum electrode 30.

Moreover, in the semiconductor device 300, a seal ring 310 is provided in place of the seal ring 210 in the semiconductor device 200. Note that also in FIG. 7, the seal ring 310 is indicated by the filled portions.

In a similar manner to the seal ring 210, the seal ring 310 is provided, in the Y direction from the contact layer LC up to and through the fifth copper wiring layer LCU5.

Figure 8:
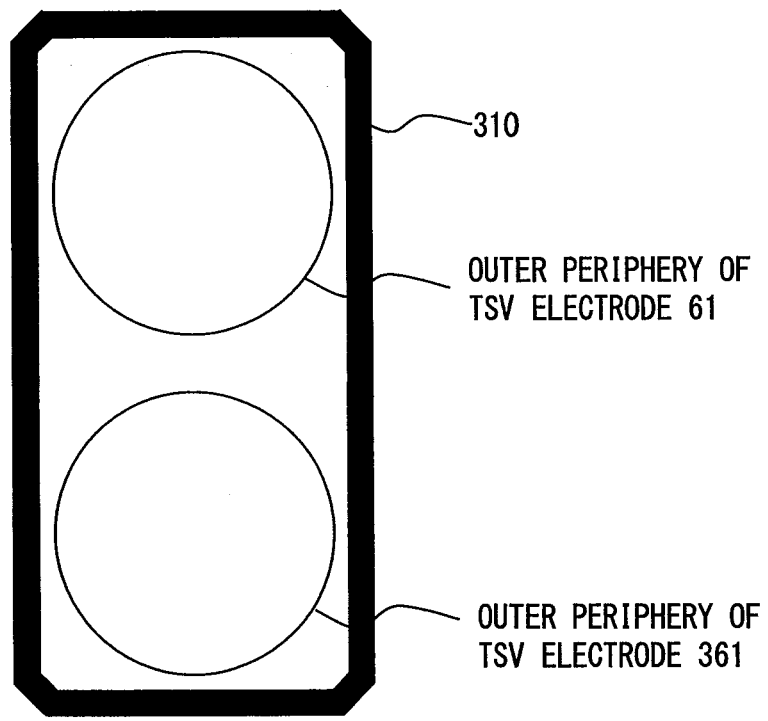
FIG. 8 is a diagram showing a positional relationship between a seal ring and a TVS in bird's eye view on a silicon substrate of the semiconductor device shown in FIG. 7.

FIG. 8 is a diagram showing a positional relationship between the TSV 60, the TSV 360, and the seal ring 310 in bird's eye view on the silicon substrate 20 from the wafer front surface.

As shown in FIG. 8, the seal ring 310 is formed in the vicinity of the TSV 60 (the TSV electrode 61, to be more specific) and the TSV 360 (the TSV electrode 361, to be specific) to surround the TSV electrode 61 and the TSV electrode 361. The shape of the seal ring 310 is an octagon in a similar manner to the seal ring 110 and the seal ring 210.

As described above, the seal ring is formed to surround the plurality of TSVs in bird's eye view on the silicon substrate, thereby suppressing generation and progress of a crack in the insulating films and also reducing the number of seal rings more than in the case of providing a seal ring for each TSV, which is advantageous for the layout of the semiconductor device.

Note that FIG. 7 shows an example in which the number of the TSVs included in the semiconductor device is two, and one seal ring is provided for the two TSVs. For example, when the number of TSVs is three or greater, these TSVs may be divided into a plurality of groups according to spaces between the TSVs and a wiring state of a semiconductor device, and the seal ring may be provided for each group.

It is obvious that the seal ring 310 may also be provided in any layer as long as the lower limit is in or below the first low relative permittivity film 51 and the upper limit is in or above the second low relative permittivity film 53 in the Y direction.

Fourth Embodiment

The semiconductor devices according to the above embodiments are examples in which the TSVs are connected to the aluminum electrodes. This technique can be applied to a semiconductor device in which a TSV is not connected to an aluminum electrode. The fourth embodiment is related to such a semiconductor device.

Figure 9:
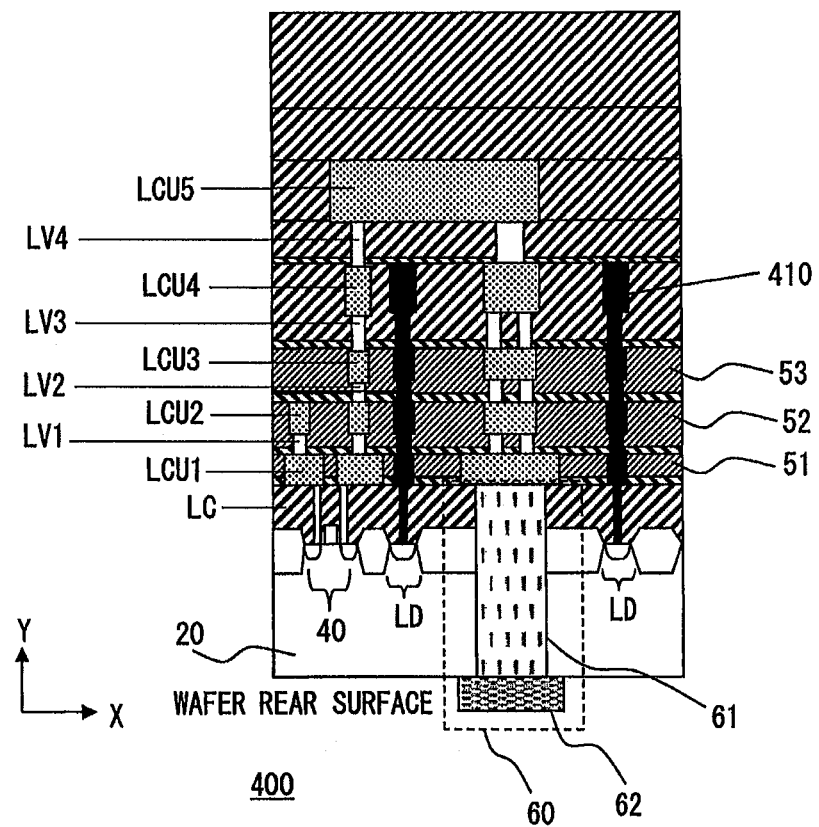
FIG. 9 is a cross-sectional diagram showing a semiconductor device according to a fourth embodiment.

FIG. 9 shows a semiconductor device 400 in a three-dimensional integrated circuit according to the fourth embodiment. This semiconductor device 400 is a semiconductor device of the topmost layer of the three-dimensional integrated circuit, for example.

As shown in FIG. 9, in the semiconductor device 400, the TSV 60 is connected through to the fifth copper wiring layer LCU5. Moreover, the fifth copper wiring layer LCU5 is connected to the semiconductor element 40 via the fourth via layer LV4, the third copper wiring layer LCU3, the third via layer LV3, the second copper wiring layer LCU2, the second via layer LV2, the first copper wiring layer LCU1, and the contact layer LC.

The seal ring 410 indicated by the filled portions is provided from the contact layer LC up to and through the copper wiring layer (the fourth copper wiring layer LCU4) that is one layer below the fifth copper wiring layer LCU5.

By doing so, the seal ring 410 will not interfere wiring from the fifth copper wiring layer LCU5 to the semiconductor element 40 and can prevent generation and/or progress of a crack in the low relative permittivity films.

Note that in the semiconductor device 400, the seal ring 410 is provided down to and through the contact layer LC in the downward direction, however the seal ring 410 may not be provided in the contact layer LC but may be provided up to and through the first low relative permittivity film 51. It is obvious that in the upward direction, the seal ring 410 may not be provided up to and through the fourth copper wiring layer LCU4 and may be provided down to and through the second low relative permittivity film 53.

Fifth Embodiment

As explained above, the seal ring is provided from the low relative permittivity film that is closest to the silicon substrate (the first low relative permittivity film) up to and through the low relative permittivity film that is farthest from the silicon substrate (the second low relative permittivity film) thereby to suppress generation and/or progress of a crack in the low relative permittivity films. The seal ring is provided down to and through the contact layer that is below the first low relative permittivity film, i.e., down to the front surface of the diffusion layer, and connected to the diffusion layer, so that the seal ring can have the same potential as the substrate. Therefore, the seal ring can be used for power supply to nearby semiconductor elements. One example is explained with reference to FIG. 9.

Figure 10:
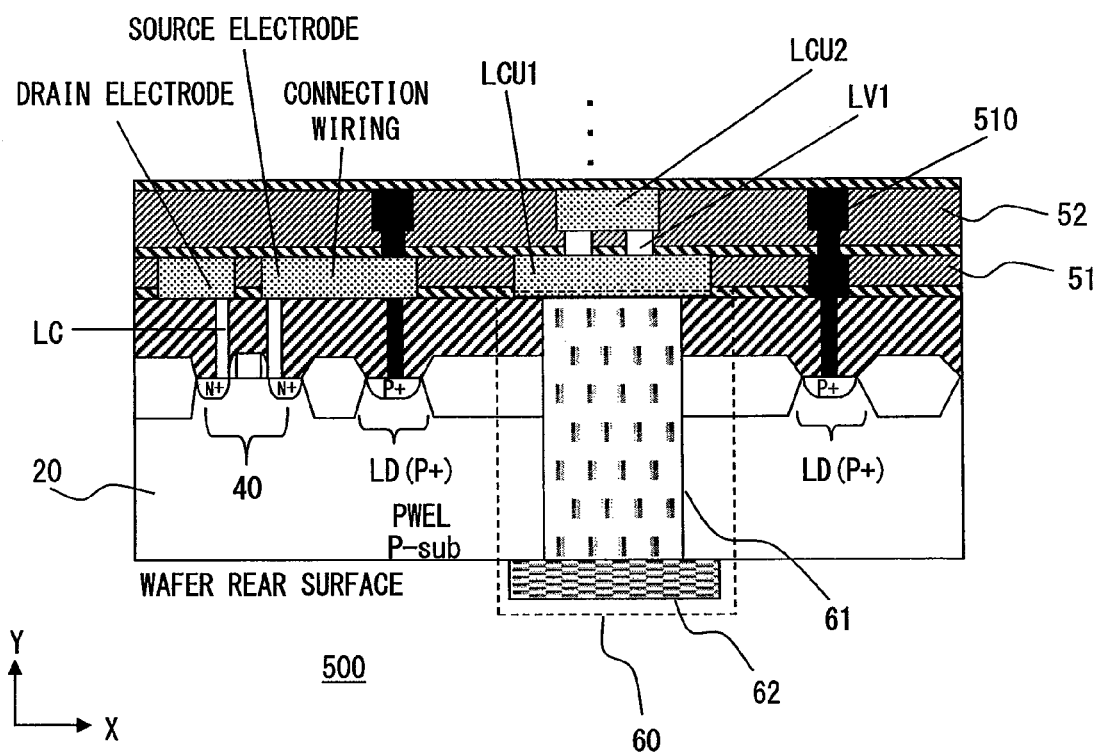
FIG. 10 is a part of a cross-sectional diagram of a semiconductor device according to a fifth embodiment.

FIG. 10 is a cross-sectional diagram of a semiconductor device 500 in a three-dimensional integrated circuit according to a fifth embodiment. In FIG. 10, only up to the second copper wiring layer LCU2 is shown and layers above the second copper wiring layer LCU2 are not shown.

In the semiconductor device 500, the seal ring 510 indicated by the filled portions is provided down to and through the diffusion layer LD.

The semiconductor element 40 is an N-type transistor, and the diffusion layer LD is a P+ diffusion layer, for example. The drain electrode and the source electrode (GND) of the semiconductor element 40 are provided in the first copper wiring layer LCU1, and supply power to the drain terminal and the source terminal of the semiconductor element 40, respectively, via the contact layer LC.

In this case, in the first copper wiring layer LCU1, the seal ring 510 is connected to the drain electrode of the semiconductor element 40 by connection wiring to enable power supply to the source terminal of the semiconductor element 40.

Sixth Embodiment

Figure 11:
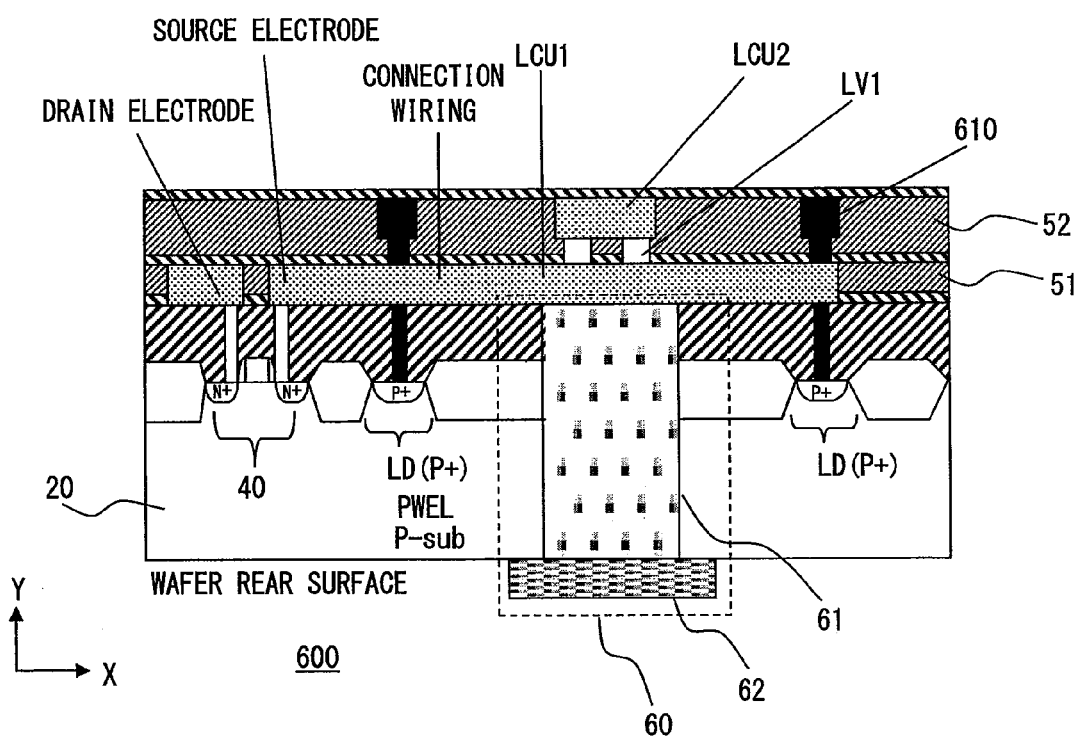
FIG. 11 is a part of a cross-sectional diagram of a semiconductor device according to a sixth embodiment.

A semiconductor device 600 according to a sixth embodiment shown in FIG. 11 is also an example in which a seal ring is provided down to and through the diffusion layer and power is supplied to a semiconductor element. Also in the semiconductor device 600, as an example, the semiconductor element 40 is an N-type transistor, and the diffusion layer LD is a P+ diffusion layer.

The TSV 60 is connected to an external GND not shown via the TSV electrode pad 62. In this case, as shown in FIG. 11, in the first copper wiring layer LCU1, a seal ring 610 is connected to the drain electrode of the semiconductor element 40 and the TSV electrode 61 of the TSV 60 by connection wiring to enable power supply to the source terminal of the semiconductor element 40.

While the invention has been described in terms of several embodiments, those skilled in the art will recognize that the invention can be practiced with various modifications within the spirit and scope of the appended claims and the invention is not limited to the examples described above.

Further, the embodiments described above can be combined as desirable by one of ordinary skill in the art and the scope of the claims is not limited by these embodiments.

Furthermore, it is noted that, Applicant's intent is to encompass equivalents of all claim elements, even if amended later during prosecution.

What is claimed is:

1. A semiconductor device comprising:
a silicon substrate;
a Through-Silicon Via (TSV) penetrating through the silicon substrate from a rear surface of the silicon substrate to a front surface of the silicon substrate;
a first low relative permittivity film disposed over the front surface of the silicon substrate;
a second low relative permittivity film disposed over the first low relative permittivity film;
a contact layer disposed over the front surface of the silicon substrate and between the silicon substrate and the first low relative permittivity film;
a semiconductor element disposed in the silicon substrate;
a seal ring disposed surrounding the TSV in a plan view,
a wiring layer connected to the semiconductor element through the contact layer;
a TSV electrode disposed in the TSV to extend through the contact layer from the rear surface of the silicon substrate;
a metal electrode disposed over the second low relative permittivity film; and
one or more wiring layers that connect the metal electrode to the TSV electrode, extend through the first low relative permittivity film and the second low relative permittivity film, and are surrounded by the seal ring,
wherein the first low relative permittivity film is the closest low relative permittivity film to the silicon substrate, and the second low relative permittivity film is the farthest low relative permittivity film from the silicon substrate, and
wherein the seal ring extends continuously from the contact layer through the second low relative permittivity film.

2. The semiconductor device according to claim 1, further comprising:
a plurality of the TSVs,
wherein the seal ring surrounds the plurality of TSVs in a plan view.

3. The semiconductor device according to claim 1, wherein the seal ring has an octangular shape.

4. The semiconductor device according to claim 2, wherein the seal ring has an octangular shape in a plan view.

5. The semiconductor device according to claim 1, wherein the wiring layer connected to the semiconductor element through the contact layer is disposed outside of the seal ring.

* * * * *